(12) United States Patent
Shih et al.

(10) Patent No.: US 6,211,511 B1
(45) Date of Patent: Apr. 3, 2001

(54) DUAL-WAVELENGTH OPTICAL PICKUP HEAD

(75) Inventors: Hsi-Fu Shih, Chang-Hua Hsien; Tzu-Ping Yang, Taipei, both of (TW); Mark O. Freeman, San Mateo, CA (US); Jinn-Kang Wang, Taipei Hsien (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 09/227,678

(22) Filed: Jan. 8, 1999

(30) Foreign Application Priority Data

Oct. 28, 1998 (TW) ................................. 87117841

(51) Int. Cl.$^7$ .................................................. H10J 40/14
(52) U.S. Cl. ..................... 250/214 R; 250/216; 369/103; 369/109
(58) Field of Search ................................. 369/103, 109, 369/112, 44; 250/216, 552, 214 R

(56) References Cited

U.S. PATENT DOCUMENTS

| | | | |
|---|---|---|---|
| 5,898,722 | * | 4/1999 | Ramdani et al. ................... 372/50 |
| 6,016,300 | * | 1/2000 | Takeda et al. ..................... 369/103 |
| 6,043,911 | * | 3/2000 | Yang ................................. 359/15 |

* cited by examiner

*Primary Examiner*—Georgia Epps
*Assistant Examiner*—Tim Thompson
(74) *Attorney, Agent, or Firm*—Jiawei Huang; J C Patents

(57) ABSTRACT

A dual-wavelength holographic laser module is provided. The dual-wavelength holographic laser module includes a holographic optical element (HOE), a multiple-element photodetector, and a laser light source that can produce a laser light with a wavelength that has, for example, two desired quantities. The laser light emitted from the laser light source with a desired wavelength can travel through the HOE and an objective lens unit, which is used to focus the laser light onto an optical disk of the DVD system, the CD system, or the CD-R system, depending on which wavelength quantity is chosen. The objective lens unit includes a single lens with a changeable NA quantity or a two-lens system that can be switched to put one lens at a time in the optical path. The optical disk reflects the laser light back to the HOE along the same light path. The reflected laser light is diffracted by the HOE to reach to the multiple-element photodetector. The photodetector receives the reflected laser light to obtain a signal, which is used for focusing and tracking, and further reads the information in the DVD system, the CD system, or the CD-R system. The laser light has a single light path even though the laser light can have two different wavelength quantities.

27 Claims, 13 Drawing Sheets

DUAL-WAVELENGTH OPTICAL PICKUP HEAD

CROSS-REFERENCE TO RELATED APPLICATION

This application claims the priority benefit of Taiwan application serial no. 87117841, filed Oct. 28, 1998, the full disclosure of which is incorporated herein by reference.

BACKGROUND OF THE INVENTION

1. Field of the Invention

This invention relates to an optical pickup head device used for accessing data, and more particularly to a laser light source, which can produce two laser lights with different wavelengths, suitable for various uses such as compact disk (CD), CD-recordable, or digital versatile disk (DVD).

2. Description of Related Art

A DVD device was successfully developed and became a commercial product at the end of 1996. The DVD device is a highlight product of computer peripheral products because the DVD with its extremely large memory capacity is able to store image, sound, information, and multimedia, for example, in just one format. The DVD has a memory capacity of about 4.7 GB, which is much larger than the 650 MB of a typical compact disk read-only memory (CD-ROM). The DVD is predicted to be a most promising product in the upcoming years. Manufacturers are now devoting a lot of effort to further developing DVD player technology. Since the main purpose of the DVD player is to include all various media in one storage format, the DVD player should have the capability to read all currently existing types of optical disks, which includes compact disk (CD), CD-read only memory (CD-ROM), and CD-recorder (CD-R). In a CD optical pickup head, the laser light source has a wavelength of 780 nm, and the numerical aperture (NA) of the objective lens is about 0.45. However, DVD players use a laser light source with a wavelength of 635 nm or 650 nm. In order to satisfy the requirement of reading CD's as well as DVD's, several efforts were made to design an objective lens system with two different NA's, NA 0.6 for DVD and NA 0.38 for CD. The early-stage DVD player could therefore accurately focus the light to a small spot both through the 0.60 mm DVD substrate thickness and the 1.2 mm CD substrate thickness. So, early-stage DVD players could also read CD's, and thus was both DVD and CD compatible.

However, it still could not read a CD-R optical disk. Generally, the recording material on the CD-R optical disk has very low reflectivity to a laser light with a wavelength of 635 nm or 650 nm so that the CD-R can only be read by an optical pickup head having a laser light with a wavelength of 780 nm. This resulted in the inability of the early-stage DVD players to read information stored on CD-R media. Nowadays, since the CD-R optical disk is extremely popular, it has become necessary to create a DVD player that is compatible with the CD-R media. Current DVD-ROM pickup head designs usually include two lasers having wavelengths of 650 nm and 780 nm respectively, in order to also read all of the CD system products. As a result, the DVD-ROM player needs to include one more light path for a laser light with a wavelength of 780 nm. This not only increases the dimensions and complexity of the optical pickup head but also increases the fabrication cost.

FIG. 1A is a schematic drawing, illustrating a conventional structure of an optical pickup head with a single light source. In FIG. 1A, a laser light emitted from a laser diode 102 passes a diffraction grating 104 and is incident on beam splitter 106. The beam splitter 106 reflects the laser light through a collimator lens 108. The laser light is collimated and then is focused by an objective lens 110 to reach an optical disk 112 so as to read information stored on the optical disk 112. The laser light is reflected by the optical disk 112 and travels back to the beam splitter 106 through the same light path. The laser light continuously travels through a cylindrical lens 114 and finally reaches a photodetector 116.

FIG. 1B is a schematic drawing, illustrating another conventional structure of an optical pickup head with a single light source, which uses a holographic laser module to replace a number of the traditional components used in the pickup at FIG. 1A. In FIG. 1B, a holographic laser module 120 is applied. A laser light emitted from a laser diode 122 passes a holographic optical element (HOE) 124 and then enters a collimator lens 126. After the laser light is collimated, the laser light continuously travels through an objective lens 128 and is focused onto an optical disk 130 to read information stored on the optical disk 130. The laser light follows the same light path and travels back to the HOE 124. The HOE 124 deflects the laser light onto a photodetector 132.

In summary, current DVD optical pickup heads carrying a single light source with wavelength 650 nm is not compatible with the CD-R disk medium. Moreover, although the current DVD dual-wavelength optical pickup heads can read different types of optical disks like DVD, CD, CD-ROM, and CD-R, their design is too complex and fabrication cost is too high.

SUMMARY OF THE INVENTION

It is therefore an objective of the present invention to provide a dual-wavelength holographic laser module to produce two laser lights with different wavelengths so as to have a capability to read all optical disk products used in, for example, a DVD system, a CD system, or a CD-R system.

It is another objective of the present invention to provide a dual-wavelength holographic laser module, which is designed to have a single light path and can be applied in an optical pickup head. In the optical pickup head, an objective lens unit is also included to have two changeable numerical aperture (NA) parameters. The optical pickup head including the dual-wavelength holographic laser module is much less complex.

It is still another objective of the present invention to provide a dual-wavelength holographic laser module, which produces laser light with two different wavelengths so as to fit any kind of system that needs two laser lights with different wavelengths.

In accordance with the foregoing and other objectives of the present invention, a dual-wavelength holographic laser module is provided. The dual-wavelength holographic laser module includes a holographic optical element (HOE), a photodetector, and a laser light source, which can produce a laser light with two different wavelengths. The laser light emitted from the laser light source with a desired wavelength travels through the HOE and an objective lens unit, which is used to focus the laser light onto an optical disk of the DVD system, the CD system, or the CD-R system, depending on which wavelength quantity is chosen. The objective lens unit includes a single lens with a changeable NA quantity or a two-lens system that can be switched to utilize one lens at a time. The optical disk reflects the laser light back to the HOE along the same light path. The reflected laser light is diffracted by the HOE to reach the photodetector. The photodetector receives the reflected laser light to obtain a signal, which is used for focusing and tracking, and further reads the information in the DVD system, the CD system, or the CD-R system. The laser light has a single light path even though the laser light can have two different wavelengths.

Using this dual-wavelength holographic laser module with its single light path and the objective lens unit, an optical pickup head is formed. The objective lens unit can be designed to have, for example, two NA quantities of 0.65 and 0.45 to be accordingly chosen. The optical pickup head can therefore read a disk of the DVD system, the CD system, or the CD-R system without an extra light path in the design. The structure of the optical pickup head of the invention is effectively simplified. The fabrication cost is also reduced.

BRIEF DESCRIPTION OF DRAWINGS

The invention can be more fully understood by reading the following detailed description of the preferred embodiment, with reference made to the accompanying drawings as follows.

DETAILED DESCRIPTION OF PREFERRED EMBODIMENTS

The invention discloses a dual-wavelength holographic laser module and its application in an optical pickup head. The optical pickup head of the invention can read information in a DVD system, a CD system, or a CD-R system without a need for an extra light path in the design.

Figure 1A:
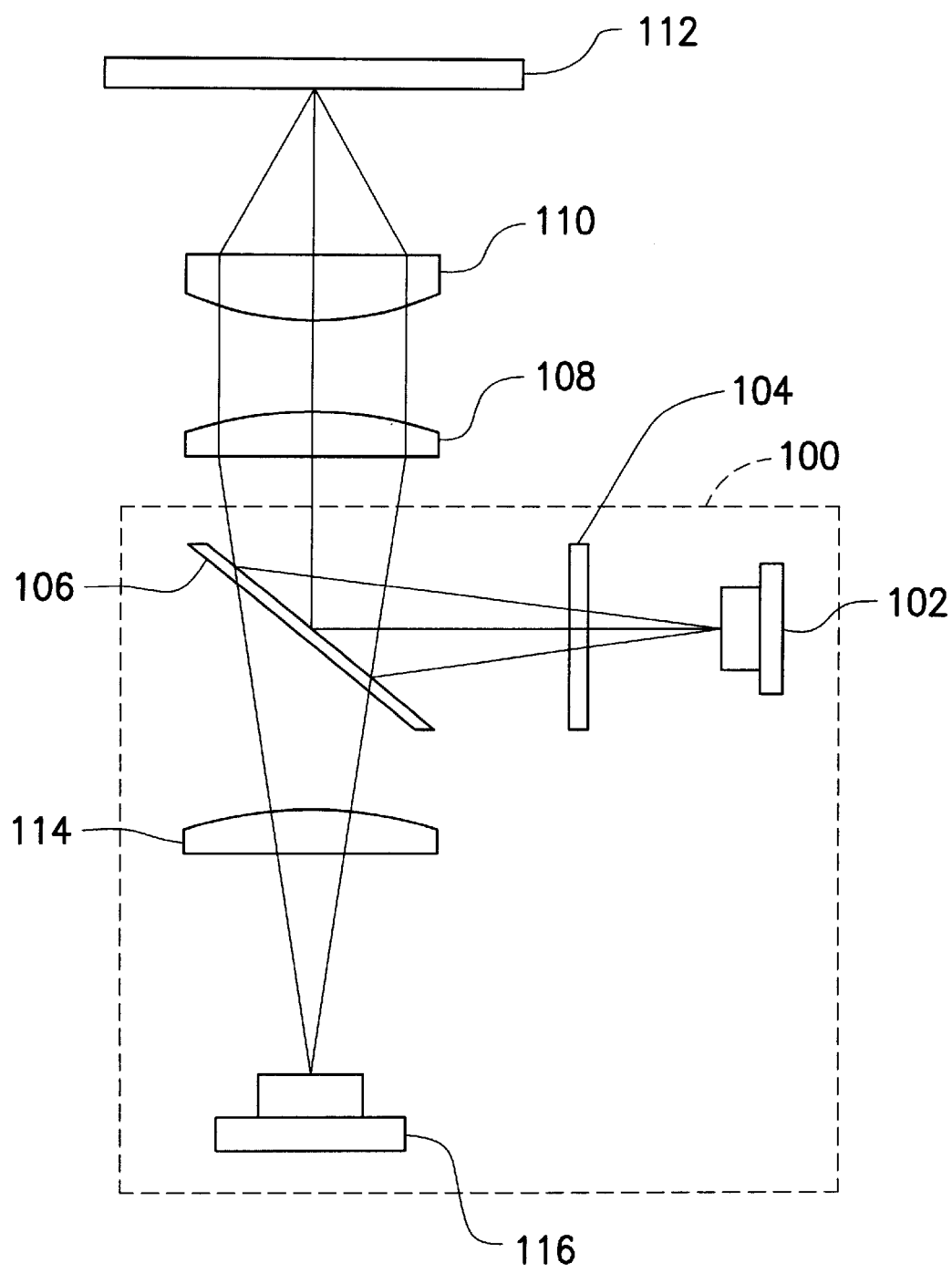
FIG. 1A is a schematic drawing of a conventional structure of an optical pickup head with a single light source, in which the optical pickup head uses traditional optical components rather than a holographic laser module.
Figure 1B:
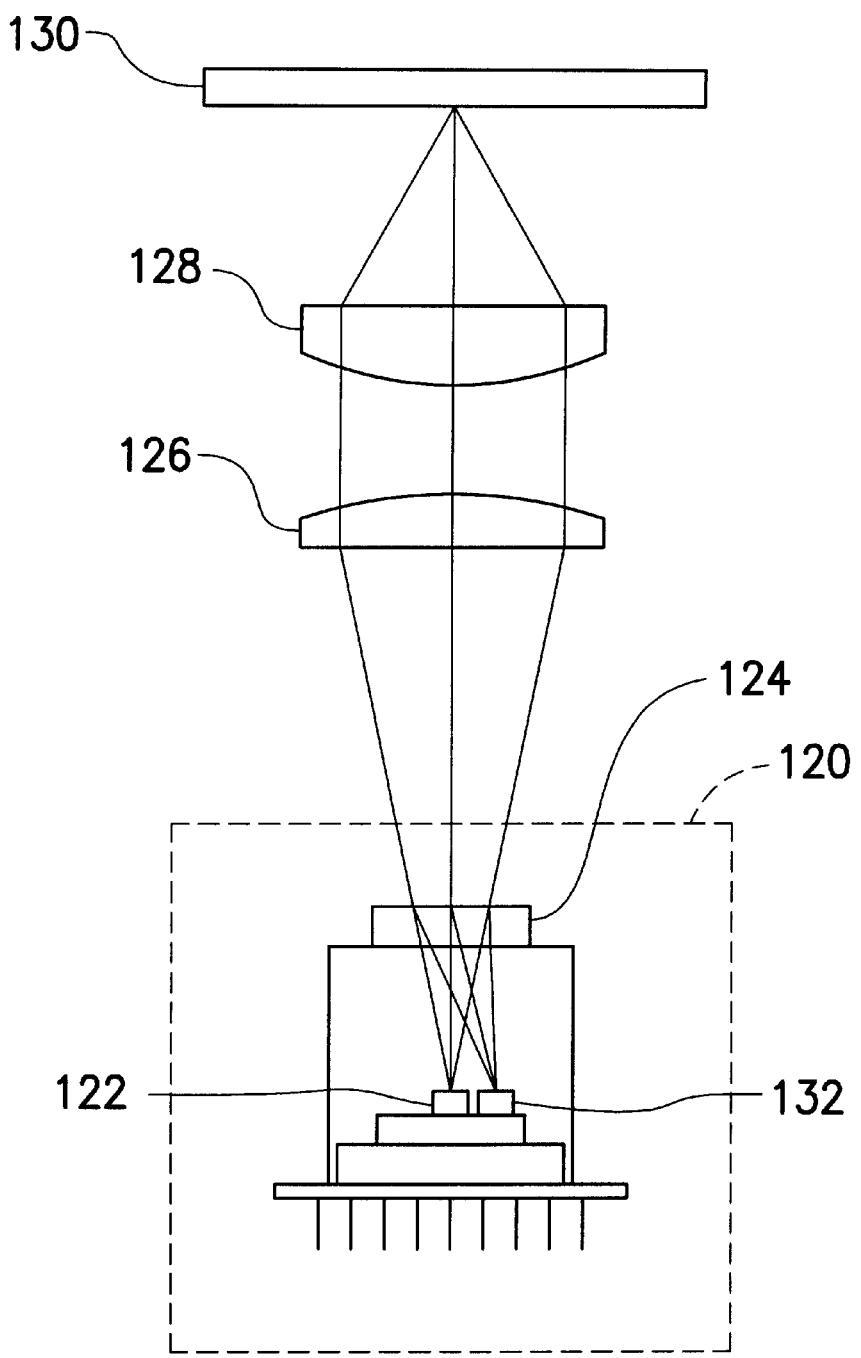
FIG. 1B is an another conventional structure of an optical pickup head with a single light source used in a holographic laser module.
Figure 2:
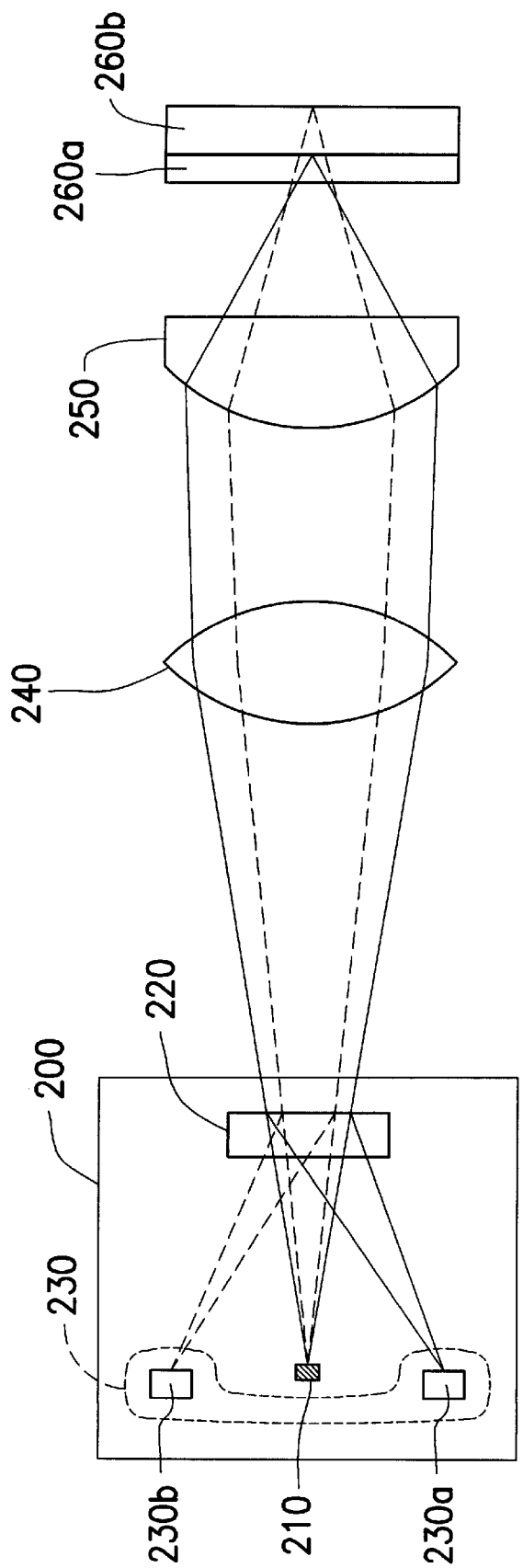
FIG. 2 is a schematic drawing of an optical pickup head including a dual wavelength holographic laser module, according to a preferred embodiment of the invention.

FIG. 2 is a schematic drawing of an optical pickup head including a dual wavelength holographic laser module, according to a preferred embodiment of the invention. In FIG. 2, a dual-wavelength holographic laser module 200 includes a laser light source 210, a photodetector 230, and a holographic optical element (HOE) 220. The laser light source 210 includes, for example, two laser diodes, which produce two different laser lights with two different wavelengths, such as 780 nm and 650 nm. A laser light with a wavelength of 780 nm can be used to read information in the CD system or CD-R system, and a laser light with a wavelength of 650 nm can be used to read information in the DVD system. In FIG. 2, a laser light with a wavelength of 650 nm is, for example, shown by a solid line and a laser light with a wavelength of 780 nm is, for example, shown by a dashed line. A laser light with a desired wavelength emitted from the laser light source 210 travels through the HOE 220 and further passes a collimator lens 240 to reach an objective lens unit 250, which focuses the laser light onto a DVD-system disk 260a (shown by the solid line) or a CD-system disk 260b (shown by the dashed line). The objective lens unit 250 includes, for example, a single lens with a changeable NA quantity or a double-lens system that changes the NA quantity by properly switching to one of these two lenses. In each reading, a laser light with a desired wavelength is emitted. When the optical pickup head is to read the DVD disk 260a, the solid line is referenced, and when the optical pickup head is to read the CD/CD-R disk 260b, the dashed line is referenced.

When the laser light reaches either the either the DVD disk 260a or the CD/CD-R disk 260b, it is reflected back to the HOE 220 along the same light path. The reflected laser light is diffracted by the HOE 220 to produce a diffraction pattern. For the laser light with wavelength of 650 nm, the first diffraction order, such as the +1 order is incident on a DVD photosensor 230a of the photodetector 230. Similarly, the −1 order of the laser light with a wavelength of 780 nm is incident on a CD photosensor 230b of the photodetector 230. The locations of the photosensors 230a, 230b have been properly chosen to allow the first order of the diffraction pattern to be detected. The photosensors 230a, 230b receive the laser light and produce a signal used for a purpose of focusing and tracking. The signal also carries the information stored on DVD disk, CD disk, or CD-R disk and can be decoded to achieve a read function.

In the above descriptions, the optical pickup head includes the dual-wavelength holographic laser module 200. The light path is a single optical path. The objective lens unit 250 includes a single lens with a changeable NA quantity or a two-lense system that can be switched to choose one so that two NA quantities of 0.65 or 0.45 can be obtained. In this manner, the laser light with wavelength of either 650 nm or 780 nm can use the same optical path design. All information in the DVD-system, CD-system, and CD-R system can be read through the single optical path without an extra light path required. The optical pickup head system is therefore effectively simplified. In the following, several examples are provided for further descriptions of the invention.

EXAMPLE 1

Figure 3A:
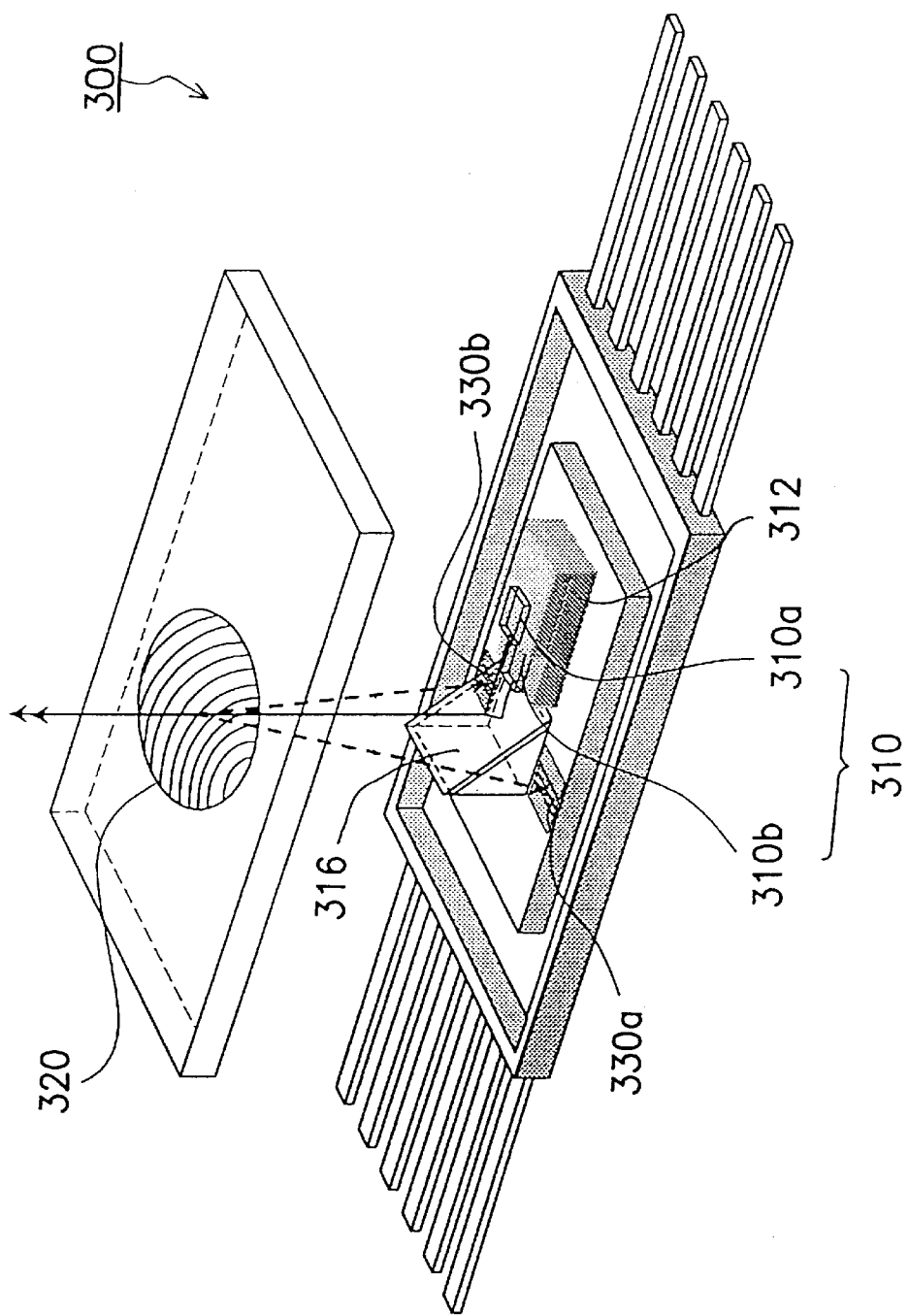
FIG. 3A is a perspective view of a dual wavelength holographic laser module, schematically illustrating its structure, according to a first preferred embodiment of the invention.

FIG. 3A is a perspective view of a dual wavelength holographic laser module, schematically illustrating its structure, according to a first preferred embodiment of the invention.

In FIG. 3A, a dual-wavelength holographic laser module 300 includes a laser light source 310, which further includes two laser diodes 310a, 310b. The laser diode 310a can produce a laser light having a wavelength of 650 nm or 635 nm, for example, and the laser diode 310b can produce a laser light having a wavelength of 780 nm, for example. The laser diodes 310a, 310b are mounted on a submount 312 in a stepped structure. For example, the laser diode 310b has a little shift from the laser diode 310a, and is also lower. Moreover, a folding mirror 316 is put in front of the laser light source 310, and is used to deflect the laser light emitted from the laser light source 310 by 90 degrees so as to allow the laser light to pass a HOE 320. Also referring to FIG. 2, after the laser light passes the HOE 320, it continuously travels through the collimator lens 240 and the objective lens unit 250, and is focused onto either the DVD disk 260a or the CD disk 260b. Furthermore, a DVD photosensor 330a and a CD photosensor 330b are respectively distributed on both sides of the folding mirror 316 at a proper location so as to be able to exactly receive the reflected laser light as described in FIG. 2.

Figure 3B:
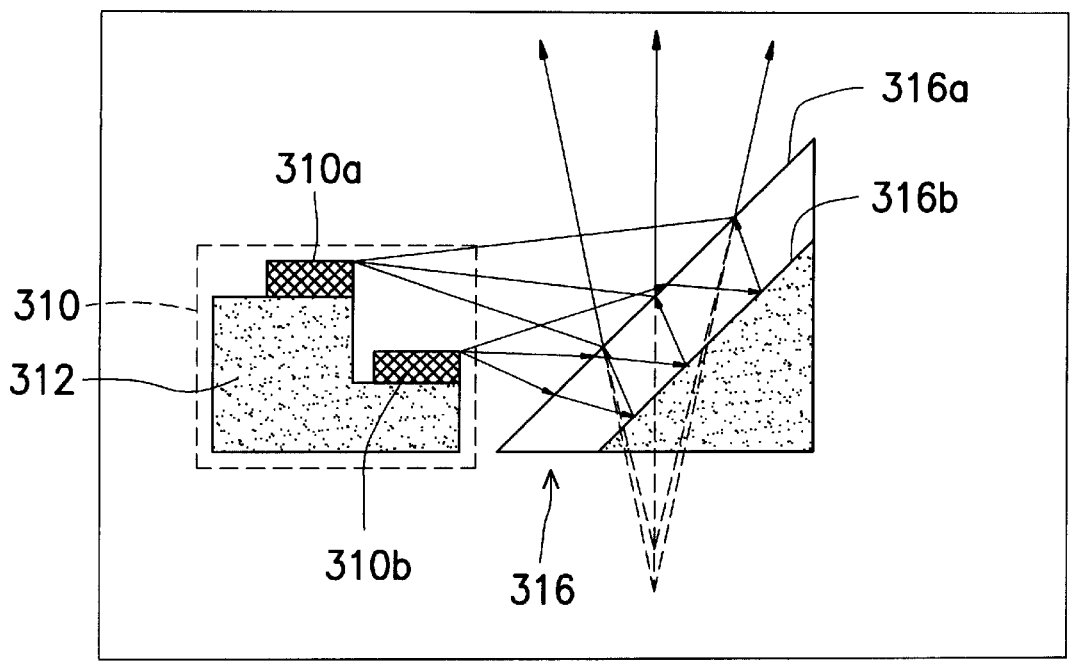
FIG. 3B is a side view of FIG. 3A, schematically illustrating relative locations between a folding mirror and a laser light source, according to a first preferred embodiment of the invention.
Figure 3C:
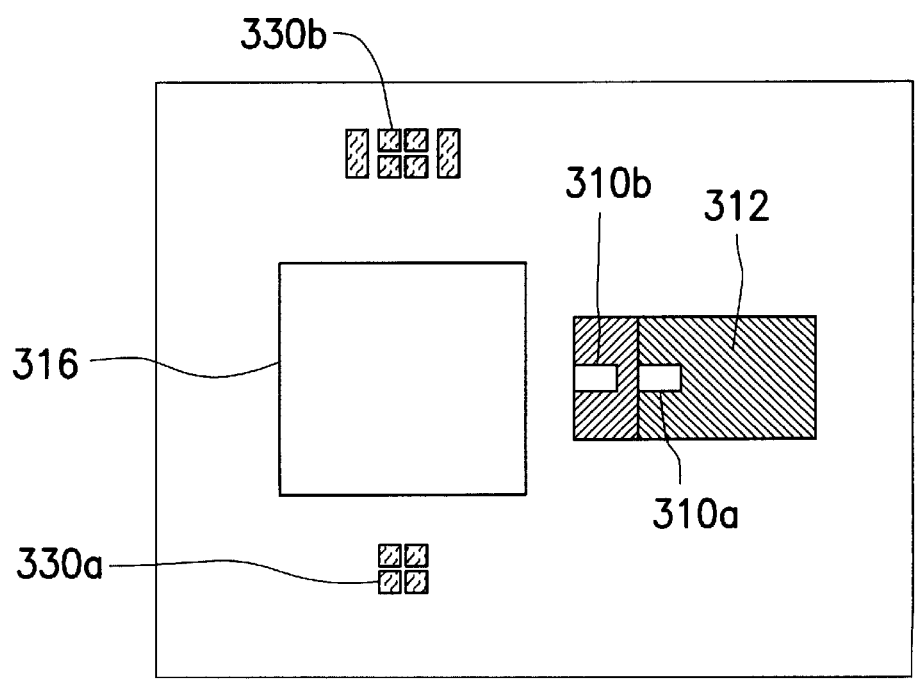
FIG. 3C is a top view of FIG. 3A, schematically illustrating relative locations of photodetectors, according to a first preferred embodiment of the invention.

FIG. 3B is a side view of FIG. 3A, schematically illustrating relative locations between a folding mirror and a laser light source, according to the first preferred embodiment of the invention. FIG. 3C is a top view of FIG. 3A, schematically illustrating relative locations of photodetectors, according to the first preferred embodiment of the invention. In FIG. 3B the laser diodes 310a, 3410b are arranged to have a stepped structure on the submount 312. The laser diode 310a can produce a laser light, for example, having a wavelength of 650 nm or 635 nm, and the laser diode 310b can produce a laser light, for example, having a wavelength of 780 nm. The folding mirror 310 is put in front of the laser light source 310, and is used to deflect the laser light emitted from the laser light source 310 by 90 degrees. The folding mirror 316 includes two reflection surfaces 316a, 316b, which are parallel to each other and are used to respectively reflect the laser light with wavelength of, for example, 650 nm or 635 nm and the laser light with wavelength of, for example, 780 nm. The previous laser light is also called a 650 nm laser light, and the later laser light is also called a 780 nm laser light. The reflection surface 316a reflects the 650 nm laser light and allows the 780 nm laser light to pass, and the reflection surface 316b reflects the 780 nm laser light. A distance between the reflection surface 316a and the reflection surface 316b is properly set to compensate a light axis shift between the 650 nm laser light and the 780 nm laser light due to the stepped structure. In FIG. 3C, the photosensors 330a, 330b are respectively located on both sides of the folding mirror in order to properly receive the reflected 650 nm laser light and the 780 nm laser light. The locations of the photosensors 330a, 330b are not symmetrical because they are used to receive laser light with different wavelengths, which causes the diffraction pattern to have different dimensions.

Figure 3D:
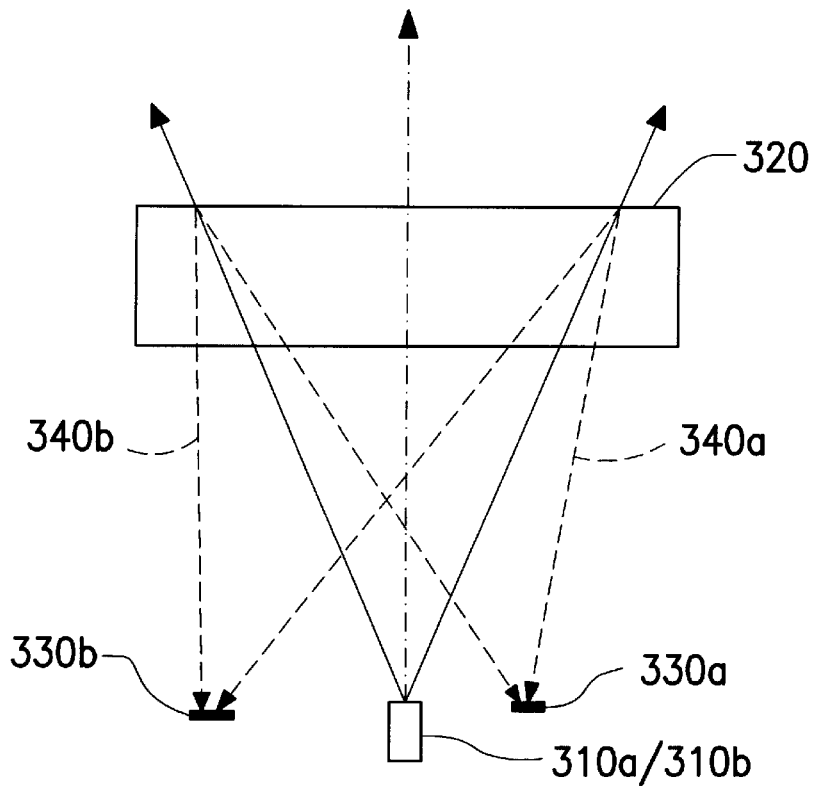
FIG. 3D is a schematic drawing, illustrating light paths of laser lights in the HOE with different wavelengths, according to a first preferred embodiment of the invention, in which the light paths respectively correspond to the DVD and CD photodetectors.

FIG. 3D is a schematic drawing, illustrating light paths of laser lights in the HOE with different wavelengths, according to a first preferred embodiment of the invention, in which the light paths respectively correspond to the DVD and CD photodetectors. In FIG. 3D, the laser light is reflected by an optical disk (not shown), such as the DVD disk 260a and the CD disk 260b of FIG. 2, to the HOE 320 along the same light path. The reflected laser light is shown in dashed lines in FIG. 3D. The reflected 650 nm laser light 340a originated from the laser diode 310a is diffracted by the HOE 320 and arrives at the DVD photosensor 330a, and the reflected 780 nm laser light 340b originated from the laser diode 310b is diffracted by the HOE 320 and arrives at the CD photosensor 330b. The reflected laser light, that is, either the 650 nm laser light 310a or the 780 nm laser light 310b is detected by the corresponding one of the photosensors 330a, 330b to produce a signal that carries information of the DVD system, CD system or the CD-R system through the reflected laser light 340a/340b. For an optical head, such as the one shown in FIG. 2, according to the arrived signal, a focus error signal and a tracking error signal are fed back to an actuator through a system control servo. The actuator then properly moves an objective lens unit to a desired track location. The action is called focusing and tracking. Moreover, the optical pickup head can be driven to proper locations to read information in the DVD system, CD system or the CD-R system.

Figure 3E:
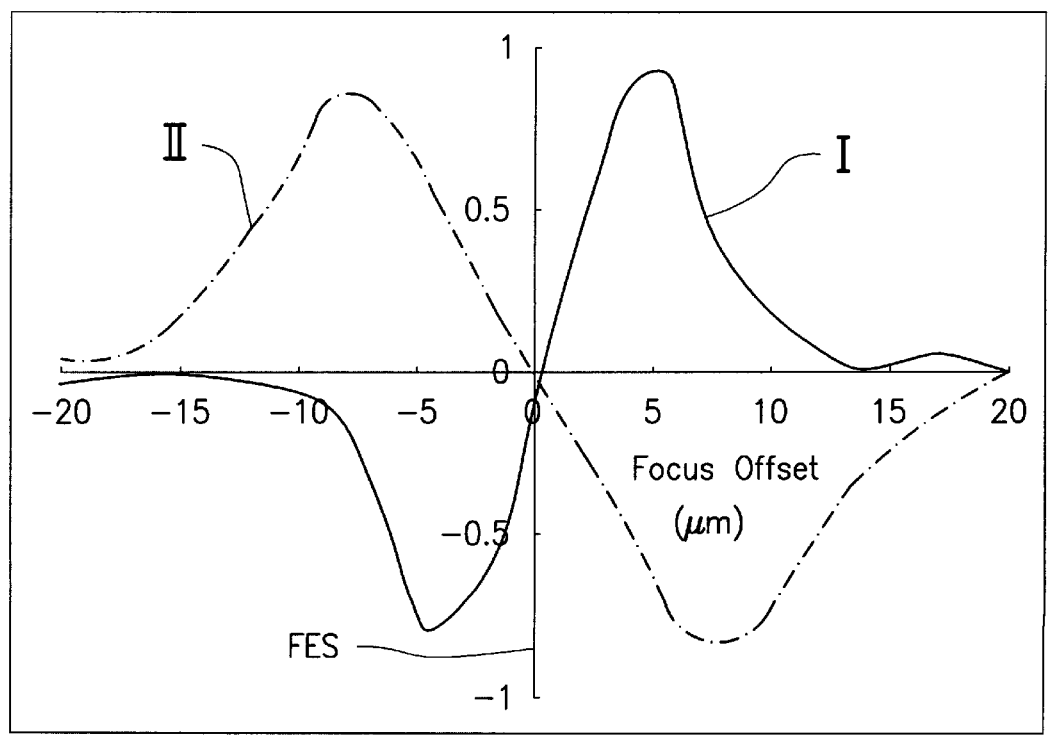
FIG. 3E is a schematic plot of the focus error signal (FES) versus the focus offset, according to a first preferred embodiment of the invention.

In this example of the invention, the DVD photosensor 330a has a location to receive the reflected laser light 340a diffracted by the HOE 320 in the +1 order of the diffraction pattern. The CD photosensor 330b has a location to receive the reflected laser light 340b diffracted by the HOE 320 in the −1 order of the diffraction pattern. Since the focus error signal (FES) induced by the diffraction of the HOE has very good conjugate property between the +1 order and the −1 order of the diffraction pattern, the FES has almost odd symmetry with respect to the focus offset quantity. This can be seen in FIG. 3E. FIG. 3E is a schematic plot of the focus error signal (FES) versus the focus offset, according to the first preferred embodiment of the invention. The solid line I represents the FES of the 650 nm laser light for DVD system versus the focus offset, and the broken line II represents the FES of the 780 nm laser light for CD system versus the focus offset. An external circuit device processes the detected signals to properly servo the lens and pickup positions and to extract the information stored on the disk.

In conclusion to example 1, the dual-wavelength holographic laser module 300 includes the HOE 320, two laser diodes 330a, 330b, and two photosensors 330a, 330b to allow the optical pickup head to be designed with a single optical path. All optical disk systems, such as the DVD system, the CD system, or the CD-R system, can be read by the optical pickup head of the invention, of which the complexity is effectively reduced.

EXAMPLE 2

Figure 4A:
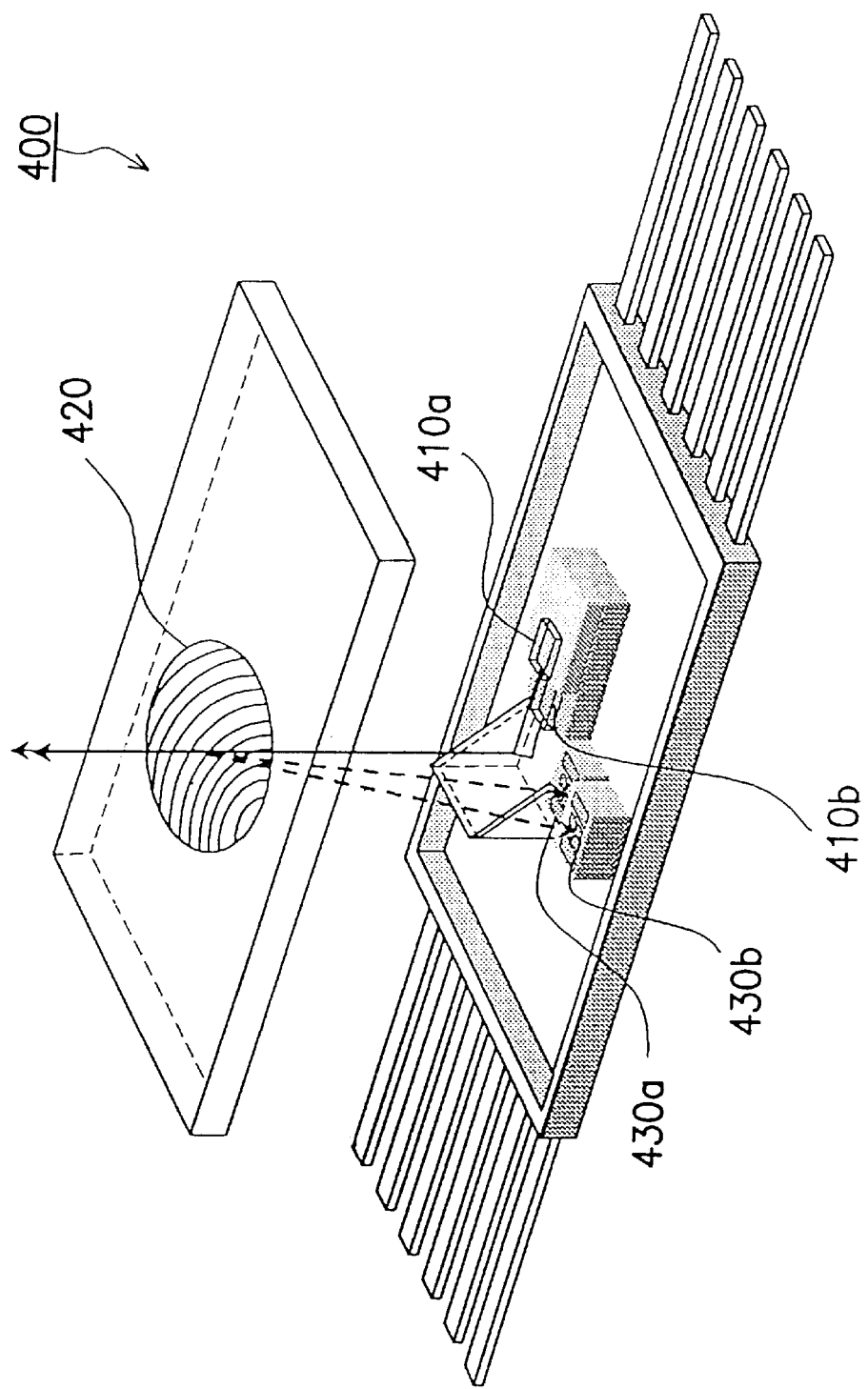
FIG. 4A is a perspective view of a dual wavelength holographic laser module, schematically illustrating its structure, according to a second preferred embodiment of the invention.
Figure 4B:
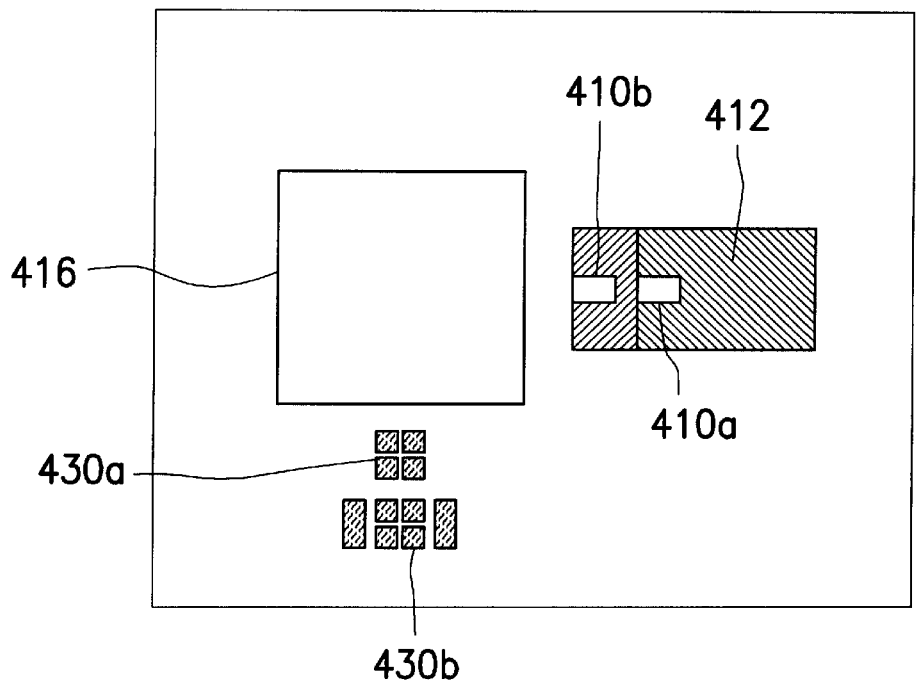
FIG. 4B is a top view of the FIG. 4A, schematically illustrating relative locations of photodetectors, according to a second preferred embodiment of the invention.

FIG. 4A is a perspective view of a dual wavelength holographic laser module, schematically illustrating its structure, according to a second preferred embodiment of the invention. FIG. 4B is a top view of the FIG. 4A, schematically illustrating relative locations of photodetectors, according to a second preferred embodiment of the invention. In FIG. 4A, a dual-wavelength holographic laser module 400 is provided with a structure similar to the one shown in FIG. 3A. The difference is the location of the photosensors 430a, 430b.

Figure 4C:
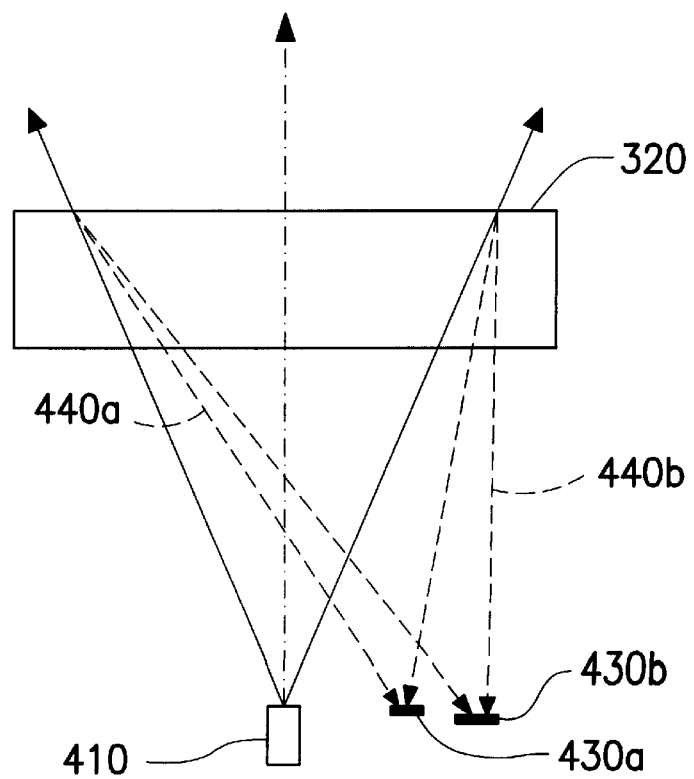
FIG. 4C is a schematic drawing, illustrating light paths of laser lights in the HOE with different wavelengths, according to a second preferred embodiment of the invention, in which the light paths respectively correspond to the DVD and CD photosensors.

In FIG. 4B, two photosensors 430a, 430b are located at the same side of a folding mirror 416. In this manner, the receiving order of the diffraction pattern on the photosensors 430a, 430b should be the same in that both receive either the +1 order or the −1 order. FIG. 4C is a schematic drawing, illustrating light paths of laser lights in the HOE with different wavelengths, according to a second preferred embodiment of the invention, in which the light paths respectively correspond to the photosensors of DVD and CD. In FIGS. 4B–4C, a reflected 650 nm laser light 440a originated from a laser diode 410a is diffracted by a HOE 420 and arrives at the DVD photosensor 430a. The reflected 780 nm laser light 440b originated from the laser diode 410b is diffracted by the HOE 420 and arrives at the CD photosensor 430b. The reflected laser light, that is, either the 650 nm laser light 410a or the 780 nm laser light 410b is detected by the corresponding photosensor 430a, 430b to produce a signal that carries information in the DVD system, CD system or the CD-R system through the reflected laser lights 440a, 440b. Both the photosensors 430a, 430b forming a photodetector receive either +1 order or −1 order of the diffraction pattern.

Figure 4D:
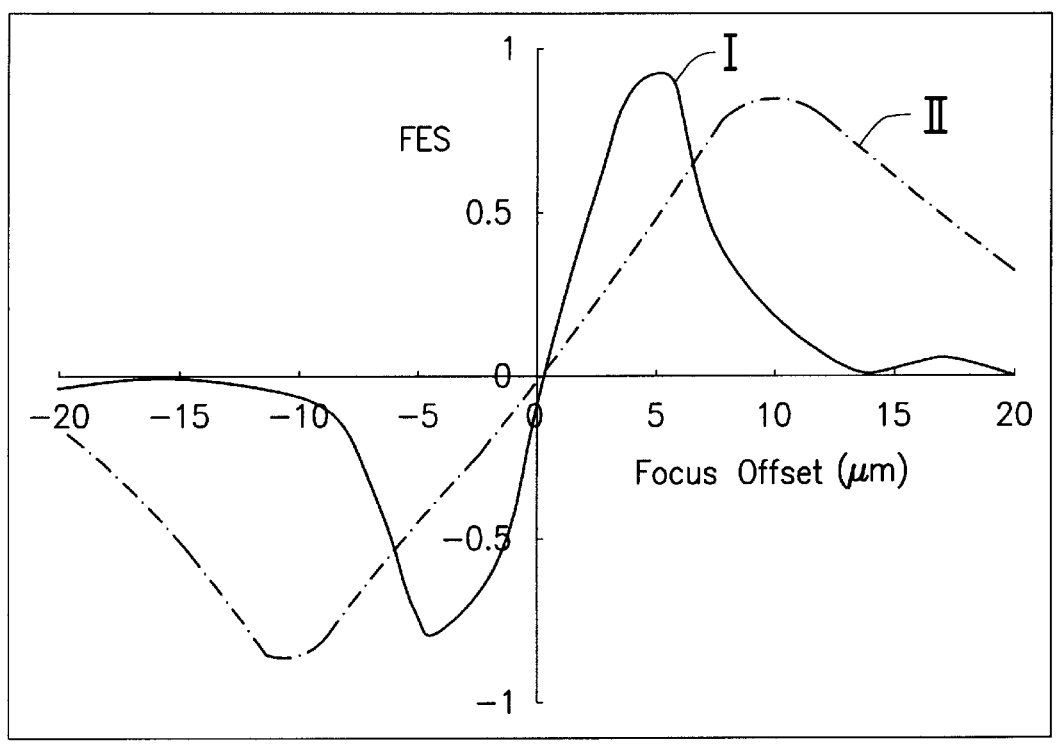
FIG. 4D is a schematic plot of the focus error signal (FES) versus the focus offset, according to a second preferred embodiment of the invention.

In this example, since the receiving order of the diffraction pattern is the same, the curve of FES versus the focus offset is different from example 1, but very similar. FIG. 4D is a schematic plot of the FES versus the focus offset, according to a second preferred embodiment of the invention. Curve I is for a DVD system, and curve II is for a CD system. The system control servo can easily process the received signals from the photosensors 430a, 430b.

EXAMPLE 3

Figure 5A:
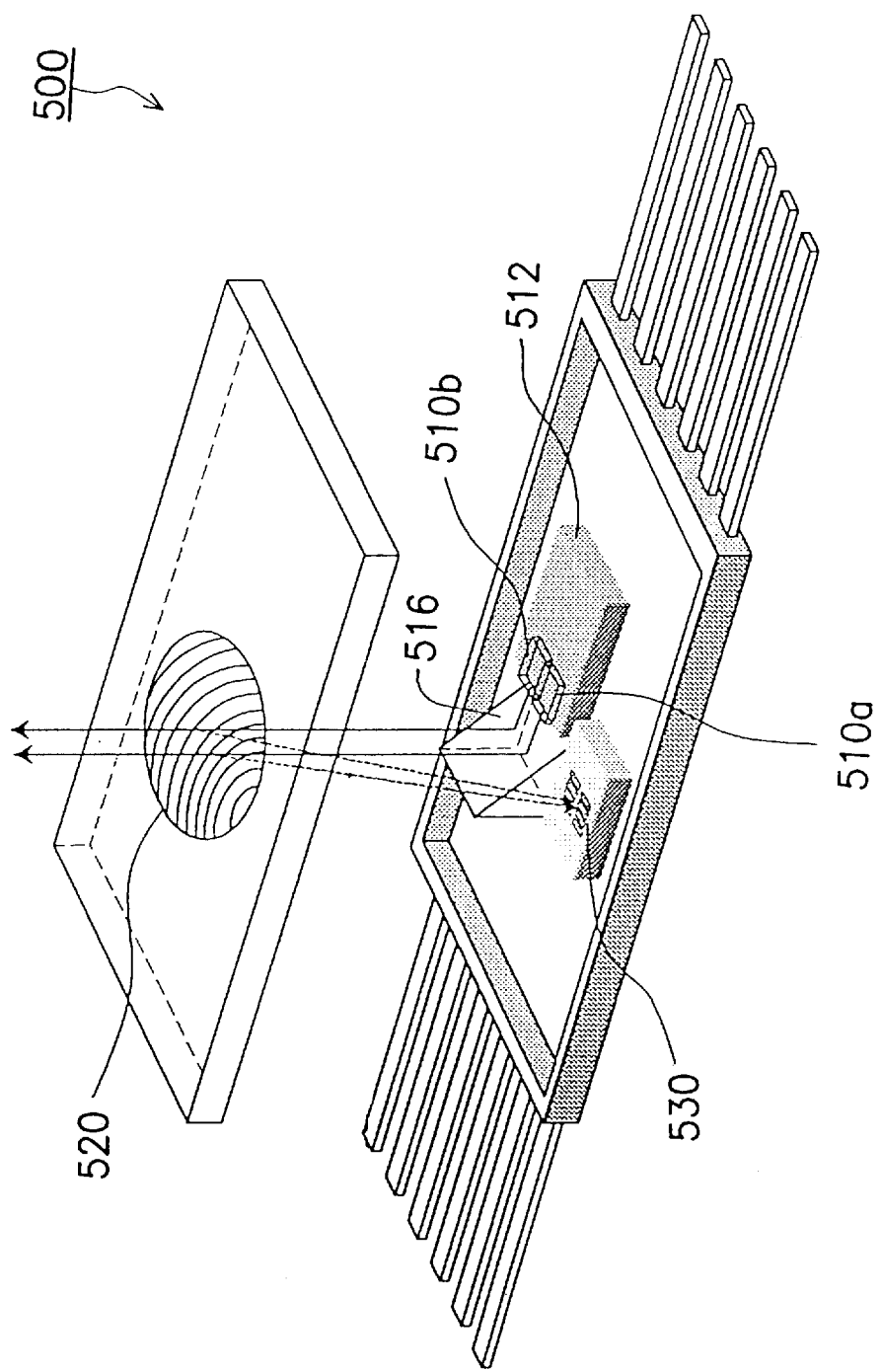
FIG. 5A is a perspective view of a dual wavelength holographic laser module, schematically illustrating its structure, according to a third preferred embodiment of the invention.
Figure 5B:
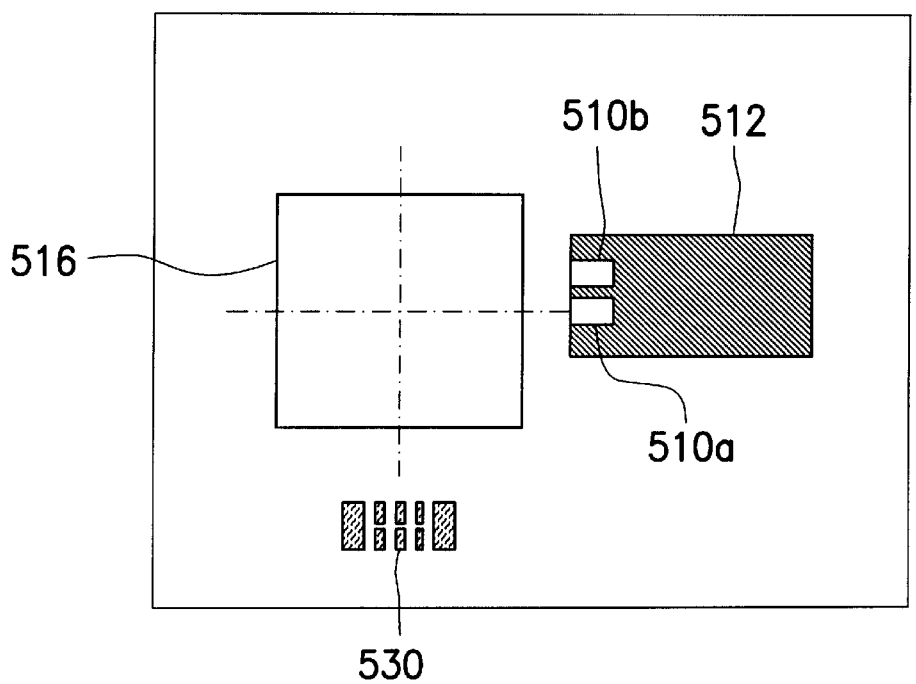
FIG. 5B is a top view of the FIG. 5A, schematically illustrating relative locations of photodetectors, according to a third preferred embodiment of the invention.

FIG. 5A is a perspective view of a dual wavelength holographic laser module, schematically illustrating its structure, according to a third preferred embodiment of the invention. The third example is introduced as a structure shown in FIG. 5A. FIG. 5B is a top view of FIG. 5A, schematically illustrating relative locations of photodetectors, according to the third preferred embodiment of the invention. In FIG. 5A and FIG. 5B, the design principle is the same as in the previous examples. The difference in the third example is that two laser diodes 510a, 510b are arranged in a parallel structure on a submount 512. In the previous examples, the laser diodes 510a, 510b are arranged in the stepped structure like those in FIG. 3A and FIG. 4A. In this arrangement, a folding mirror 516 needs only one reflection surface. A photodetector 530 including, for example, one usual photosensor is located at one side of the folding mirror 516. Since the laser diodes 510a, 510b are arranged in the parallel structure, an optical axis corresponding to each of the laser diodes 510a, 510b is shifted a little to each other, but within a tolerable range. This is because the CD system has looser conditions to perform its reading function. An optical axis of the system is set on the optical axis of the 650 nm laser light emitted by the laser diode 510a. The laser diode 510b used to produce the 780 nm laser light for a CD system is located beside the laser diode 510a. In this arrangement, the 780 nm laser light has an optical axis shift of about 200 microns to the system optical axis. This is within a tolerable range for the CD system so that it does not affect the reading quality of the CD system. The parallel structure of the laser diodes 510a, 510b has more advantages in that the system structure is further simplified, the folding mirror 516 needs only one reflection surface, and the photodetector needs only one multiple-element photosensor.

Figure 5C:
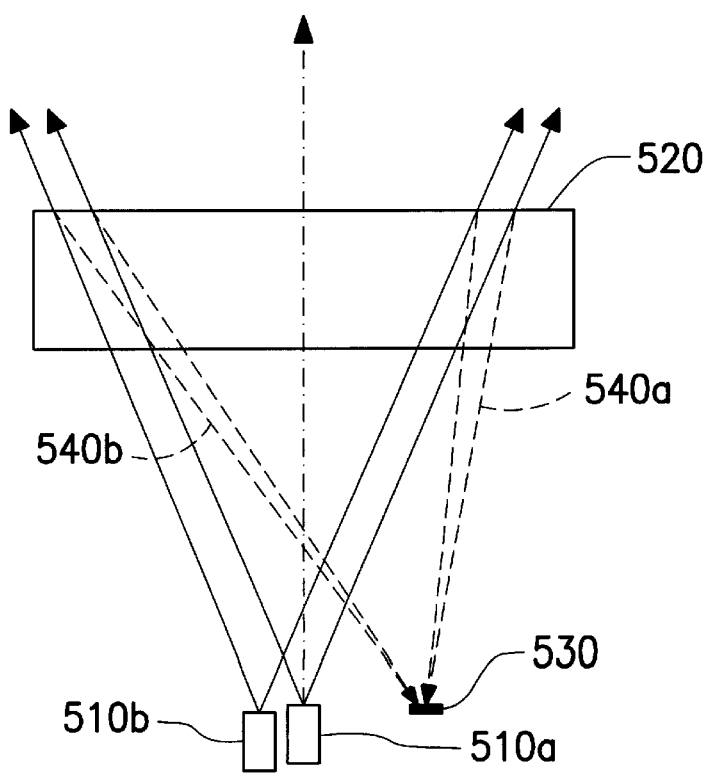
FIG. 5C is a schematic drawing, illustrating light paths of laser lights in the HOE with different wavelengths, according to a third preferred embodiment of the invention, in which the light paths respectively correspond to the DVD system and the CD system.

FIG. 5C is a schematic drawing, illustrating light paths of laser lights in the HOE with different wavelengths, according to the third preferred embodiment of the invention, in which the light paths respectively correspond to the photodetector of DVD and CD. In FIG. 5C, a reflected 650 nm laser light shown by the dashed line is diffracted by a HOE 520 along a light path 540a to reach a photodetector 530. A reflected 780 nm laser light shown by the dashed line is diffracted by the HOE 520 along a light path 540b to reach the photodetector 530.

Both the light path 540a and the light path 540b have the same −1 order or +1 order of the diffraction pattern. Due to the difference of the wavelengths, the reflected 780 nm laser light and the reflected 650 laser light have different diffraction angles and causes an optical axis shift, which is compensated for by the optical axis shift due to a proper distance between the laser diodes 510a and 510b. Therefore, the light path 540a and the light path 540b can reach the photodetector 530.

Figure 5D:
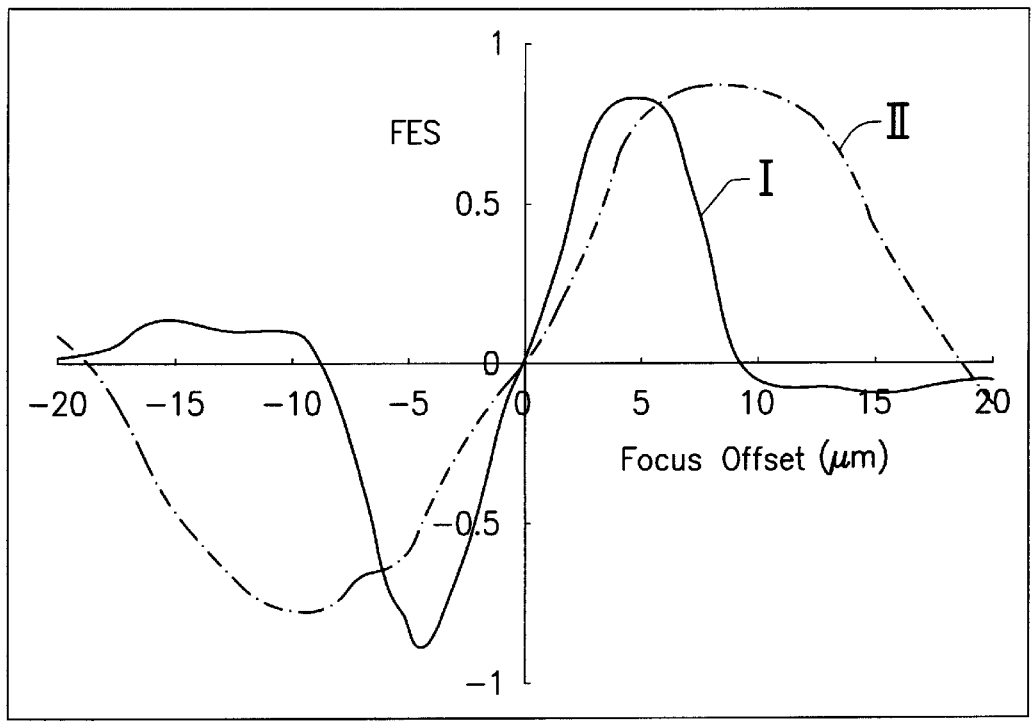
FIG. 5D is a schematic plot of the focus error signal (FES) versus the focus offset, according to a second preferred embodiment of the invention.

Two curves I, II of the FES versus the focus offset for the example 3 are also shown in FIG. 5D. The curves I, II have similar S-like shapes. The system control servo can easily process the received signals from the photosensors.

EXAMPLE 4

Figure 6:
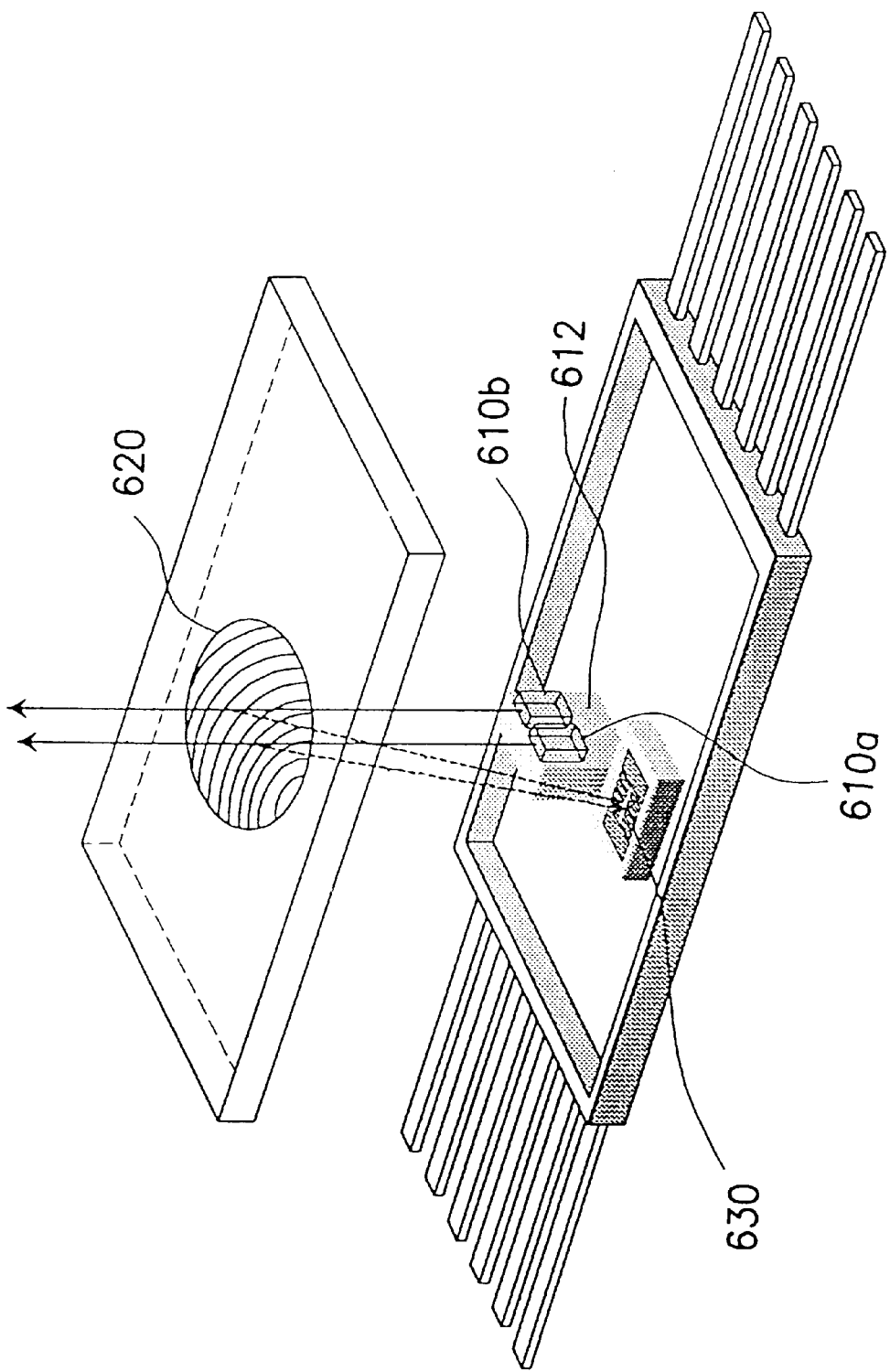
FIG. 6 is a perspective view of a dual wavelength, schematically illustrating its structure, according to a fourth preferred embodiment of the invention.

FIG. 6 is a perspective view of a dual wavelength, schematically illustrating its structure, according to a fourth preferred embodiment of the invention. This fourth example is similar to the third example but has a further simplification. Two laser diodes 610a, 610b are now vertically mounted, for instance, glued, on a submount 612 so that the laser diodes 610a and 610b can respectively emit a 650 nm laser light and a 780 nm laser light directly upward from the submount 612. This gives an advantage that a similar light path is obtained without a folding mirror like the folding mirror 516 of FIG. 5A. The light paths and the curve of the FES versus the focus offset have similar properties, and are not further described in this fourth example. A further simplification is performed in the fourth example.

In conclusion of the above four examples, the dual-wavelength holographic laser module includes at least one HOE, two laser diodes, and a photodetector, which may includes a single photosensor or two photosensors. The dual-wavelength laser module can be applied in an optical pickup head to allow the optical pickup head to be designed to have a single optical path. In the optical pickup head of the invention, the objective lens unit is also included to have two NA quantities of, for example, 0.6 and 0.45. The laser light with a wavelength of, for example, 650 nm or 635 nm can read the DVD system. The laser light with a wavelength of, for example, 780 nm can read all types of CD related systems, such as CD, CD-R, or CD-ROM. The complexity of the optical pickup head is effectively reduced.

Several characteristics are summarized as follows:

1. A dual-wavelength holographic laser module can produce two laser lights with different wavelengths so as to have a capability to read all optical disk products used in the DVD system, CD system, CD-ROM, or CD-R system.

2. A dual-wavelength holographic laser module is applied in the optical pickup head, which can therefore be designed to have a single light path. The complexity of the optical pickup head is effectively reduced.

3. The dual-wavelength holographic laser module, which can produce a laser light with a wavelength that can have two different quantities, can fit any kind of system that needs two laser lights with different wavelengths.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A dual-wavelength holographic laser module comprising:
    a laser light source, which comprises a first laser diode and a second laser diode so as to respectively produce a first laser light with a first wavelength and a second laser light with a second wavelength;
    a holographic optical element (HOE), located at a location, where the first laser light and the second laser light can pass through, wherein when the first laser light and the second laser light are reflected by a media object, they can reach the HOE again and are diffracted by the HOE into two different diffraction angles; and
    a photodetector, which comprises a first photosensor and a second photosensor to respectively detect the first laser light and the second laser light after being diffracted.

2. The laser module of claim 1, wherein the first laser light comprises a wavelength of 650 nm.

3. The laser module of claim 1, wherein the first laser light comprises a wavelength of 635 nm.

4. The laser module of claim 1, wherein the second laser light comprises a wavelength of 780 nm.

5. The laser module of claim 1, wherein the first photosensor and the second photosensor are located at two different sides of the photodetector.

6. The laser module of claim 1, wherein the first photosensor and the second photosensor are located at a same side of the photodetector.

7. The laser module of claim 1, wherein the laser module further comprises a folding mirror to properly deflect the first laser light and the second laser light.

8. The laser module of claim 1, wherein the laser module is suitable for use in an optical head, which further comprises an objective lens unit located in front of the laser module, and is used to focus the first laser light and the second laser light onto the media object.

9. The laser module of claim 8, wherein the objective lens unit comprises a single lens with a changeable numerical aperture (NA) quantity.

10. The laser module of claim 8, wherein the objective lens unit comprises two lens, which can be switched so as to obtain two different NA quantities.

11. The laser module of claim 8, wherein the optical head further comprises a collimator lens between the laser module and the objective lens unit so as to adjust light paths of the first laser light and the second laser light.

12. A dual-wavelength holographic laser module comprising:
    a laser light source, which comprises a first laser diode and a second laser diode so as to respectively produce a first laser light with a first wavelength and a second laser light with a second wavelength;
    a folding mirror, located in front of the laser light source to deflect the first laser light and the second laser light by 90 degrees;
    a holographic optical element (HOE), located where the first laser light and the second laser light can pass through after being deflected by the folding mirror, wherein when the first laser light and the second laser light are reflected by a media object, they can reach the HOE again and are diffracted by the HOE into two different diffraction angles; and
    a photodetector, which comprises a first photosensor and a second photosensor to respectively detect the first laser light and the second laser light after being diffracted.

13. The laser module of claim 12, wherein the first laser light comprises a wavelength of about 650 nm.

14. The laser module of claim 12, wherein the first laser light comprises a wavelength of about 635 nm.

15. The laser module of claim 12, wherein the second laser light comprises a wavelength of about 780 nm.

16. The laser module of claim 12, wherein the first laser diode and the second laser diode are designed to have a stepped structure.

17. The laser module of claim 12, wherein the folding mirror comprises a first reflection surface and a second reflection surface parallel to the first reflection surface, in which the first reflection surface reflects the first laser light but allows the second laser light to pass, and the second reflection surface reflects the second laser light.

18. The laser module of claim 17, wherein the first photosensor and the second photosensor are respectively located on both sides of the folding mirror.

19. The laser module of claim 17, wherein the first photosensor and the second photosensor are located on the same side of the folding mirror.

20. The laser module of claim 17, wherein the laser module is suitable for use in an optical head to read various optical disk systems.

21. A dual-wavelength holographic laser module comprising:
    a laser light source, which comprises a first laser diode and a second laser diode so as to respectively produce a first laser light with a first wavelength and a second laser light with a second wavelength, wherein the first laser diode and the second laser diode are mounted on a submount in parallel, and an optical axis of the first laser light is used as a system optical axis;
    a holographic optical element (HOE), located at a location, where the first laser light and the second laser light can pass through after being reflected by the folding mirror, wherein when the first laser light and the second laser light are reflected by a media object, they can reach the HOE again and are diffracted by the HOE into two different diffraction angles; and
    a photodetector to detect the first laser light and the second laser light after being diffracted by the HOE.

22. The laser module of claim 21, wherein the first wavelength comprises a wavelength of 650 nm.

23. The laser module of claim 21, wherein the first wavelength comprises a wavelength of 635 nm.

24. The laser module of claim 21, wherein the second wavelength comprises a wavelength of 780 nm.

25. The laser module of claim 21, wherein the first laser diode and the second laser diode are vertically glued on the submount so that the first laser light and the second laser light can directly reach the HOE.

26. The laser module of claim 21, wherein the laser module is suitable for use in an optical head to read various optical disk systems.

27. The laser module of claim 26, wherein the distance between the first laser diode and the second laser diode is used to compensate an optical axis of the second laser light to the system optical axis in the optical head.

* * * * *